United States Patent
Baek et al.

(10) Patent No.: US 9,508,410 B1
(45) Date of Patent: Nov. 29, 2016

(54) SEMICONDUCTOR DEVICE HAVING A SECONDARY ADDRESS GENERATING UNIT FOR GENERATING ADDRESS SIGNAL IN RESPONSE TO ADDRESS SIGNAL FROM A FIRST ADDRESS GENERATING UNIT

(71) Applicant: SK hynix Inc., Icheon-si, Gyeonggi-do (KR)

(72) Inventors: Seung Geun Baek, Seoul (KR); Jae Il Kim, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/925,605

(22) Filed: Oct. 28, 2015

(30) Foreign Application Priority Data

Jul. 6, 2015 (KR) .................. 10-2015-0096149

(51) Int. Cl.
| | | |
|---|---|---|
| G11C 8/00 | (2006.01) | |
| G11C 7/22 | (2006.01) | |
| G11C 8/10 | (2006.01) | |
| G11C 8/18 | (2006.01) | |
| G11C 11/4076 | (2006.01) | |

(52) U.S. Cl.
CPC .............. *G11C 7/222* (2013.01); *G11C 8/10* (2013.01); *G11C 8/18* (2013.01); *G11C 7/22* (2013.01); *G11C 11/4076* (2013.01)

(58) Field of Classification Search
CPC ............. G11C 7/22; G11C 8/12; G11C 8/10; G11C 8/08; G11C 8/18; G11C 11/4076; G11C 7/1072
USPC .................... 365/191, 230.06, 230.19, 233.1
See application file for complete search history.

(56) References Cited

U.S. PATENT DOCUMENTS 6,907,555 B1    6/2005  Nomura et al.
7,843,757 B2 *  11/2010 Ko ........................... G11C 8/12
                                                  365/194

FOREIGN PATENT DOCUMENTS

KR        1020090093306 A        9/2009

* cited by examiner

*Primary Examiner* — David Lam
(74) *Attorney, Agent, or Firm* — William Park & Associates Ltd.

(57) ABSTRACT

A semiconductor device includes a control signal generating unit, a first address generating unit, and a second address generating unit. The control signal generating unit generates a read/write control signal and a selection control signal in response to an active signal. The first address generating unit generates a first address signal in response to the selection control signal and a second address signal. The second address generating unit generates the second address signal in response to the read/write control signal and the first address signal.

20 Claims, 9 Drawing Sheets

SEMICONDUCTOR DEVICE HAVING A SECONDARY ADDRESS GENERATING UNIT FOR GENERATING ADDRESS SIGNAL IN RESPONSE TO ADDRESS SIGNAL FROM A FIRST ADDRESS GENERATING UNIT

CROSS-REFERENCE TO RELATED APPLICATIONS

The present application claims priority under 35 U.S.C 119(a) to Korean Patent Application No. 10-2015-0096149 filed on Jul. 6, 2015, in the Korean Intellectual Property Office, which is incorporated herein by reference in its entirety.

BACKGROUND

1. Technical Field

Embodiments of the present disclosure generally relate to integrated circuits, and more particularly to semiconductor devices controlling an input of data and to semiconductor systems including the same.

2. Related Art

As semiconductor devices become more complex, the process of testing semiconductor devices is also becoming more complex, and thus the amount of test time continues to increase.

In order to reduce test times and overall test costs, various methods for testing the semiconductor devices during an evaluation period of their reliability are being developed. For instance, a Test During Burn-In (hereinafter referred to as "TDBI") process, which may be performed after the semiconductor packaging is carried out, is one of the test methods that can achieve faster test times at lower costs. The TDBI process includes a process for determining whether the semiconductor device normally operates or not by repeating a write operation with a simple pattern on a semiconductor device assembled in a package to apply excessive stress to the semiconductor device. For instance, during the TDBI process, the stress may be applied to the semiconductor device by repeatedly executing write operations with a simple data pattern for a long time (e.g., up to a couple of hours) at a relatively high temperature (e.g., up to about 100° C.) with a relatively high power supply voltage.

In order to efficiently test a semiconductor device before the semiconductor packaging is carried out, the semiconductor device may include a Built-In Self-Test (hereinafter referred to as "BIST") circuit. In addition, the semiconductor device may also include a Built-In Self-Repair (hereinafter referred to as "BISR") circuit to improve the semiconductor device yield, and repair circuits such as the BISR are widely used to repair defects detected by Wafer level Burn-In (hereinafter referred to as "WBI") test. Here, the BISR circuit of a semiconductor device may include the BIST circuit, a Built-In Self-Diagnostics (hereinafter referred to as "BISD") circuit, a Built-In Redundancy Analysis (hereinafter referred to as "BIRA") circuit, or the like.

SUMMARY

Various embodiments are directed to semiconductor devices and semiconductor systems including the same.

According to an embodiment, a semiconductor device includes a control signal generating unit, a first address generating unit, and a second address generating unit. The control signal generating unit generates a read/write control signal and a selection control signal in response to an active signal. The first address generating unit generates a first address signal in response to the selection control signal and a second address signal. The second address generating unit generates the second address signal in response to the read/write control signal and the first address signal.

According to another embodiment, a semiconductor system includes a first semiconductor device and a second semiconductor device. The first semiconductor device is suitable for outputting a command. The second semiconductor device is suitable for generating a read/write control signal and a selection control signal in response to an active signal that is generated by decoding the command, is suitable for generating a first address signal in response to the selection control signal and a second address signal, and is suitable for generating the second address signal in response to the read/write control signal and the first address signal.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
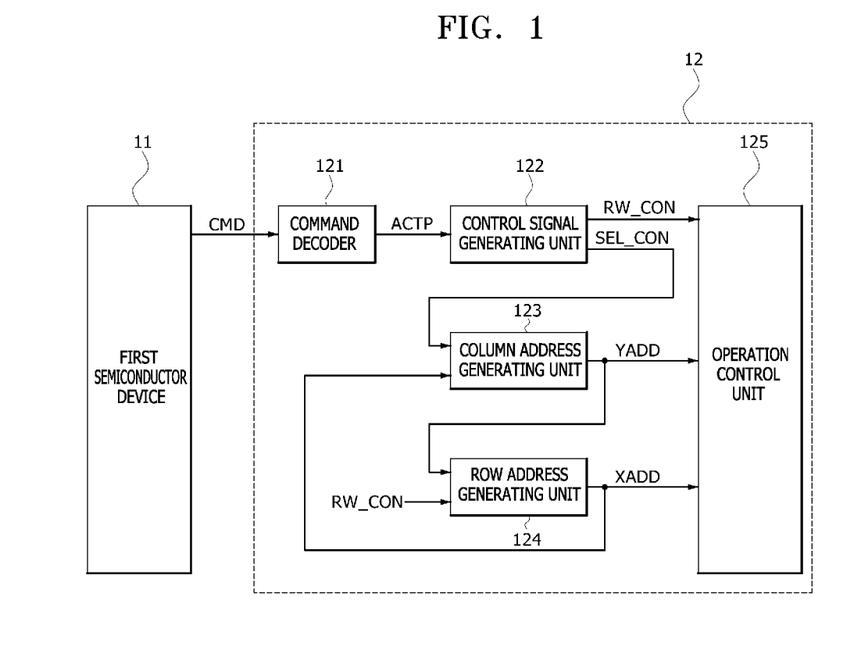
FIG. 1 is a block diagram illustrating a configuration of a semiconductor system according to an embodiment.

As illustrated in FIG. 1, a semiconductor system according to an embodiment may include a first semiconductor device 11 and a second semiconductor device 12. The second semiconductor device 12 may include a command decoder 121, a control signal generating unit 122, a column address generating unit 123, a row address generating unit 124, and an operation control unit 125. The first semiconductor device 11 may provide a command CMD to the second semiconductor device 12. The first semiconductor device 11 may include a circuit that adjusts the timing of the command CMD (e.g., a point in time when the command CMD is applied to the second semiconductor device 12).

According to various embodiments, various types of circuits may be used to adjust the timing of the command CMD.

The command decoder 121 may generate an active signal ACTP in response to the command CMD. The active signal ACTP may include pulse signals that are generated in synchronization with points in time when active operations start. The command CMD may include a signal that is encoded into a plurality of bits according to various embodiments. A logic-level combination of the command CMD generating the active signal ACTP may vary according to various embodiments.

The control signal generating unit 122 may generate a read/write control signal RW_CON and a selection control signal SEL_CON in response to the active signal ACTP. The control signal generating unit 122 may generate the selection control signal SEL_CON whose logic level changes whenever the pulses of the active signal ACTP are generated. In an embodiment, the control signal generating unit 122 may generate the read/write control signal RW_CON whose logic level changes in synchronization with a rising edge of the selection control signal SEL_CON. In another embodiment, the read/write control signal RW_CON may change its logic level in synchronization with a falling edge of the selection control signal SEL_CON. The selection control signal SEL_CON may have a combination of logic levels that indicates a certain address. The logic-level combination for selecting a specific address may vary according to various embodiments. The read/write control signal RW_CON may have logic levels that indicate a read operation and a write operation. For example, the read/write control signal RW_CON may be set to have a logic high level for a read operation and may be set to have a logic low level for a write operation. The logic levels of the read/write control signal RW_CON for executing the read operation and the write operation may vary according to various embodiments.

The column address generating unit 123 may generate a column address signal YADD in response to the selection control signal SEL_CON and a row address signal XADD. The column address generating unit 123 may generate an $n^{th}$ column address (e.g., Y(n) of FIG. 3) and an $(n+1)^{th}$ column address (e.g., Y(n+1) of FIG. 3) in response to the row address signal XADD. The column address generating unit 123 may select, in response to the selection control signal SEL_CON, one of the $n^{th}$ column address (e.g., Y(n) of FIG. 3) and the $(n+1)^{th}$ column address (e.g., Y(n+1) of FIG. 3) to output the selected one as the column address signal YADD. Here, "n" may be set as a natural number. The column address signal YADD may be a signal including a plurality of bits according to an embodiment. The fact that the $n^{th}$ column address (e.g., Y(n) of FIG. 3) is selected and outputted as the column address signal YADD means that the $n^{th}$ column address (e.g., Y(n) of FIG. 3), which is selected among a plurality of column addresses included in the column address signal YADD, is enabled.

The row address generating unit 124 may generate the row address signal XADD in response to the read/write control signal RW_CON and the column address signal YADD. If the read/write control signal RW_CON having a predetermined logic level is inputted to the row address generating unit 124 in a situation where a predetermined row address included in the row address signal XADD is enabled, the row address generating unit 124 may generate the row address signal XADD by using a counter circuit. For example, if a write operation of memory cells accessed by the $(n+1)^{th}$ column address (e.g., Y(n+1) of FIG. 3) is performed while an $n^{th}$ row address (e.g., X(n) of FIG. 5), which is selected among a plurality of row addresses included in the row address signal XADD, is activated, the row address signal XADD may be generated such that an $(n+1)^{th}$ row address (e.g., X(n+1) of FIG. 5), which is selected among the plurality of row addresses included in the row address signal XADD, is activated.

The operation control unit 125 may control the execution of read and write operations in response to the row address signal XADD, the column address signal YADD, and the read/write control signal RW_CON. For example, if the $n^{th}$ row address (e.g., X(n) of FIG. 5) of the row address signal XADD and the $(n+1)^{th}$ column address (e.g., Y(n+1) of FIG. 5) of the column address signal YADD are activated in a situation where the read/write control signal RW_CON has a logic low level, a write operation of memory cells accessed by the $n^{th}$ row address (e.g., X(n) of FIG. 5) and the $(n+1)^{th}$ column address (e.g., Y(n+1) of FIG. 5) may be performed.

Figure 2:
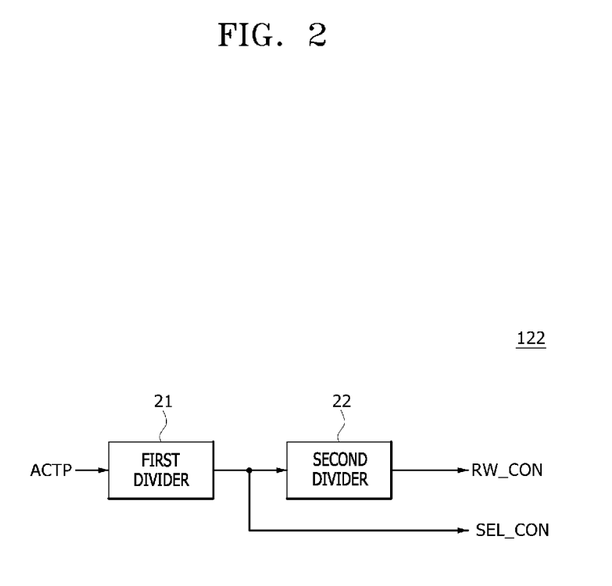
FIG. 2 is a block diagram illustrating a configuration of a control signal generating unit included in the semiconductor system of FIG. 1.

Referring to FIG. 2, the control signal generating unit 122 may include a first frequency divider 21 and a second frequency divider 22. The first frequency divider 21 may generate the selection control signal SEL_CON by dividing the frequency of the active signal ACTP. The first frequency divider 21 may generate the selection control signal SEL_CON whose logic level changes whenever the pulses of the active signal ACTP are generated. For instance, in a case where the first frequency divider 21 includes a divide-by-two circuit, the selection control signal SEL_CON may be generated by dividing the frequency of the active signal ACTP by two. The second frequency divider 22 may divide the frequency of the selection control signal SEL_CON to generate the read/write control signal RW_CON. In an embodiment, the second frequency divider 22 may generate the read/write control signal RW_CON whose logic level changes in synchronization with a rising edge of the selection control signal SEL_CON. In another embodiment, the read/write control signal RW_CON may change its logic level in synchronization with a falling edge. In a case where the second frequency divider 22 includes a divide-by-two circuit, the read/write control signal RW_CON may be generated by dividing the frequency of the selection control signal SEL_CON by two.

Figure 3:
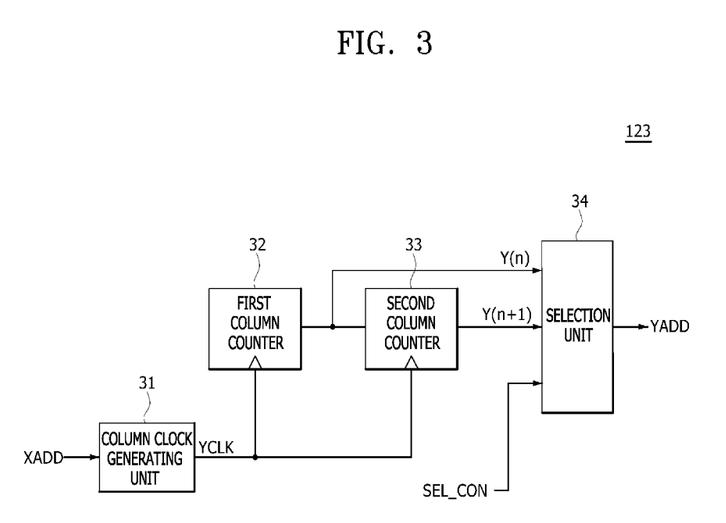
FIG. 3 is a block diagram illustrating a configuration of a column address generating unit included in the semiconductor system of FIG. 1.

Referring to FIG. 3, the column address generating unit 123 may include a column clock generating unit 31, a first column counter 32, a second column counter 33, and a selection unit 34.

The column clock generating unit 31 may generate a column clock YCLK in response to the row address signal XADD. If a predetermined row address among the row addresses included in the row address signal XADD is activated, the column clock generating unit 31 may generate a pulse of the column clock YCLK. For example, in a case where the row address signal XADD includes first to $M^{th}$ row addresses X(1:M), if the first row address X(1) or the $M^{th}$ row address X(M) is activated, the column clock generating unit 31 may generate a pulse of the column clock YCLK.

The first column counter 32 may generate the $n^{th}$ column address Y(n) of the column address signal YADD in synchronization with the pulse of the column clock YCLK. The first column counter 32 may generate the $n^{th}$ column address Y(n) by counting up every time the pulse of the column clock YCLK is inputted to the first column counter 32. For example, if the column address signal YADD includes first to $K^{th}$ column addresses Y(1:K), the first column counter 32 may sequentially generate the first column address Y(1) to the $(K-1)^{th}$ column address Y(K-1) by counting up every time the pulse of the column clock YCLK is inputted.

The second column counter 33 may activate/generate the $(n+1)^{th}$ column address $Y(n+1)$ of the column address signal YADD in synchronization with the pulse of the column clock YCLK. The second column counter 33 may generate the $(n+1)^{th}$ column address $Y(n+1)$ by counting up every time the pulse of the column clock YCLK is inputted. For example, if the column address signal YADD includes first to $K^{th}$ column addresses $Y(1:K)$, the second column counter 33 may sequentially generate the second column address $Y(2)$ to the $K^{th}$ column address $Y(K)$ by counting up every time the pulse of the column clock YCLK is inputted.

The selection unit 34 may select and output the $n^{th}$ column address $Y(n)$ or the $(n+1)^{th}$ column address $Y(n+1)$ as the column address signal YADD in response to the selection control signal SEL_CON. For example, the selection unit 34 may select the $n^{th}$ column address signal $Y(n)$ and output it as the column address signal YADD if the selection control signal SEL_CON has a logic high level, and the selection unit 34 may select the $(n+1)^{th}$ column address signal $Y(n+1)$ and output it as the column address signal YADD if the selection control signal SEL_CON has a logic low level. The logic level of the selection control signal SEL_CON for selecting the $n^{th}$ column address $Y(n)$ or the $(n+1)^{th}$ column address $Y(n+1)$ as the column address signal YADD may vary according to various embodiments. The fact that the $n^{th}$ column address $Y(n)$ is selected and outputted as the column address signal YADD means that the $n^{th}$ column address $Y(n)$, which is selected among the plurality of column addresses included in the column address signal YADD, is activated.

Figure 4:
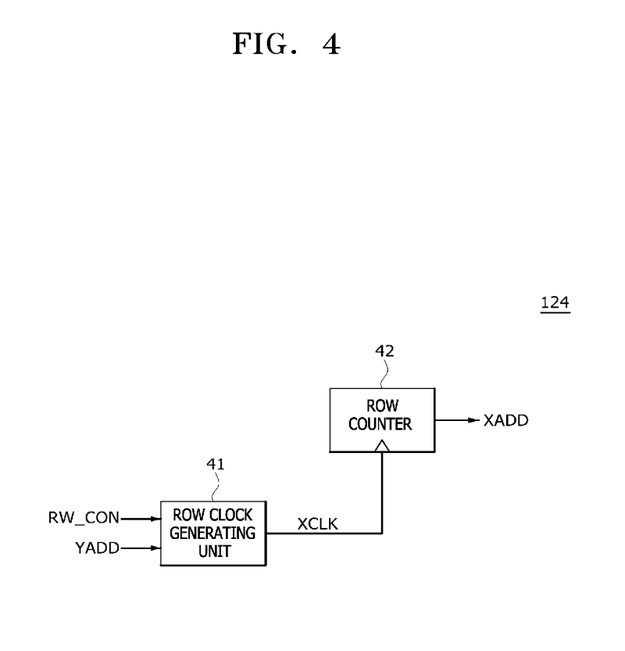
FIG. 4 is a block diagram illustrating a configuration of a row address generating unit included in the semiconductor system of FIG. 1.

Referring to FIG. 4, the row address generating unit 124 may include a row clock generating unit 41 and a row counter 42.

The row clock generating unit 41 may generate a row clock XCLK in response to the read/write control signal RW_CON and the column address signal YADD. If a write operation of memory cells corresponding to the $(n+1)^{th}$ column address $Y(n+1)$ is performed, the row clock generating unit 41 may generate a pulse of the row clock XCLK. For example, if the $(n+1)^{th}$ column address $Y(n+1)$ included in the column address signal YADD is activated while the read/write control signal RW_CON has a logic low level, the row clock generating unit 41 may generate the pulse of the row clock XCLK.

The row counter 42 may count a number of pulses of the row address signal XADD in synchronization with the pulse of the row clock XCLK. For example, if the row address signal XADD includes first to $M^{th}$ row addresses $X(1:K)$, the row counter 42 may sequentially generate the first row address $X(1)$ to the $M^{th}$ row address $X(M)$ by counting up every time the pulse of the row clock XCLK is inputted.

Figure 5:
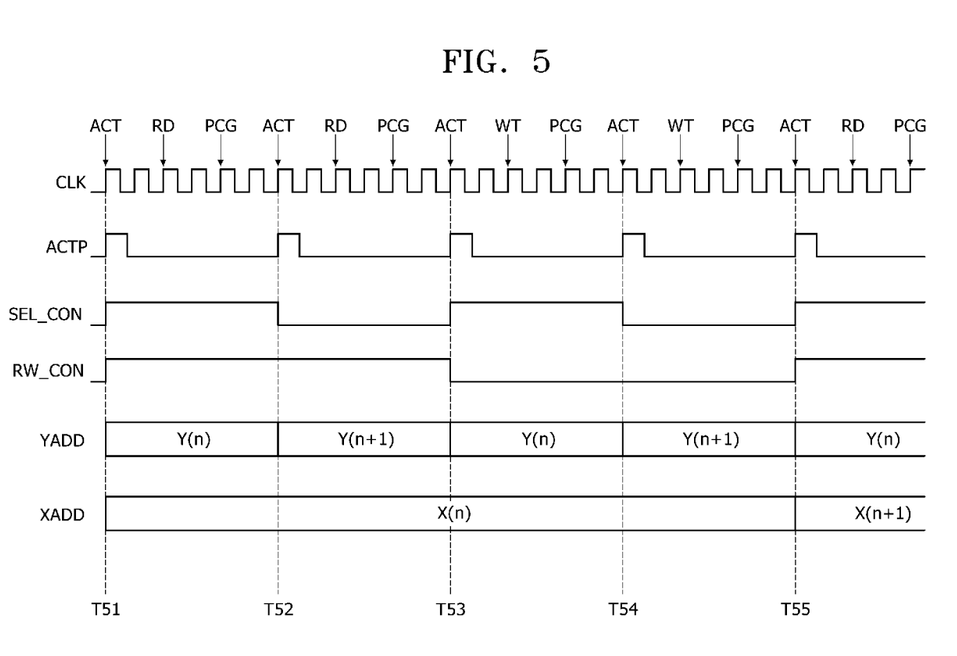
FIG. 5 is a timing diagram illustrating an operation of the semiconductor system of FIG. 1 to FIG. 4.

An operation of the semiconductor system having the configuration described with reference to FIG. 1 to FIG. 4 will be described hereinafter with reference to FIG. 5.

At a point in time T51, if an active command ACT included in the command CMD is inputted to the second semiconductor device 12, a first pulse of the active signal ACTP may be generated. At the point in time T51, a logic level of the selection control signal SEL_CON may change from a logic low level to a logic high level in response to the first pulse of the active signal ACTP to activate the $n^{th}$ column address $Y(n)$ included in the column address signal YADD. In addition, it is assumed that the $n^{th}$ row address $X(n)$ of the row address signal XADD is activated. At the point in time T51, a level of the read/write control signal RW_CON may be changed from a logic low level into a logic high level in response to the selection control signal SEL_CON whose level is changed from a logic low level into a logic high level.

In a time period between the point in time T51 and a point in time T52, if a read command RD and a pre-charge command PCG are sequentially inputted through the command CMD, a read operation of the memory cells accessed by the $n^{th}$ row address $X(n)$ and the $n^{th}$ column address $Y(n)$, which are activated, may be performed.

At the point in time T52, if the active command ACT included in the command CMD is inputted to the second semiconductor device 12, a second pulse of the active signal ACTP may be generated. At the point in time T52, a logic level of the selection control signal SEL_CON may change from a logic high level into a logic low level in response to the second pulse of the active signal ACTP to activate the $(n+1)^{th}$ column address $Y(n+1)$ included in the column address signal YADD.

In a time period between the point in time T52 and a point in time T53, if the read command RD and the pre-charge command PCG are sequentially inputted through the command CMD, the read operation of memory cells accessed by the $n^{th}$ row address $X(n)$ and the $(n+1)^{th}$ column address $Y(n+1)$, which are activated, may be performed.

At the point in time T53, if the active command ACT included in the command CMD is inputted to the second semiconductor device 12, a third pulse of the active signal ACTP may be generated. At the point in time T53, a logic level of the selection control signal SEL_CON may change from a logic low level into a logic high level in response to the third pulse of the active signal ACTP to activate the $n^{th}$ column address $Y(n)$ included in the column address signal YADD. In addition, a logic level of the read/write control signal RW_CON may be changed from a logic high level into a logic low level in response to the selection control signal SEL_CON whose level is changed from a logic low level to a logic high level.

In a time period between the point in time T53 and a point in time T54, if a write command WT and the pre-charge command PCG are sequentially inputted through the command CMD, a write operation of memory cells accessed by the $n^{th}$ row address $X(n)$ and the $n^{th}$ column address $Y(n)$, which are activated, may be performed.

At the point in time T54, if the active command ACT included in the command CMD is inputted to the second semiconductor device 12, a fourth pulse of the active signal ACTP may be generated. At the point in time T54, a logic level of the selection control signal SEL_CON may be changed from a logic high level into a logic low level in response to the fourth pulse of the active signal ACTP to activate the $(n+1)^{th}$ column address $Y(n+1)$ included in the column address signal YADD.

In a time period between the point in time T54 and a point in time T55, if the write command WT and the pre-charge command PCG are sequentially inputted through the command CMD, the write operation of memory cells accessed by the $n^{th}$ row address $X(n)$ and the $(n+1)^{th}$ column address $Y(n+1)$, which are activated, may be performed.

At the point in time T55, if the active command ACT included in the command CMD is inputted to the second semiconductor device 12, a fifth pulse of the active signal ACTP may be generated. At the point in time T55, a logic level of the selection control signal SEL_CON may be changed from a logic low level into a logic high level in response to the fifth pulse of the active signal ACTP to activate the $n^{th}$ column address $Y(n)$ included in the column address signal YADD. In addition, a logic level of the read/write control signal RW_CON may be changed from a logic low level into a logic high level in response to the selection control signal SEL_CON whose level is changed from a logic low level to a logic high level.

At the point in time T55, since the write operation of the memory cells accessed by the $n^{th}$ row address X(n) and the $(n+1)^{th}$ column address Y(n+1) terminates, the $(n+1)^{th}$ row address X(n+1) included in the row address signal XADD may be activated.

In a time period after the point in time T55, if the read command RD and the pre-charge command PCG are sequentially inputted through the command CMD, the read operation of memory cells accessed by the $(n+1)^{th}$ row address X(n+1) and the $n^{th}$ column address Y(n), which are activated, may be performed.

As described above, in some embodiment, the semiconductor device may automatically generate the row address signal XADD and the column address signal YADD by counting up in synchronization with the pulses of the active signal ACTP, which are sequentially generated, and may sequentially perform the read operation and the write operation of the memory cells accessed by the counted row address signal XADD and the counted column address signal YADD while the row address signal XADD and the column address signal YADD are automatically generated. Thus, the total test time may be reduced.

Figure 6:
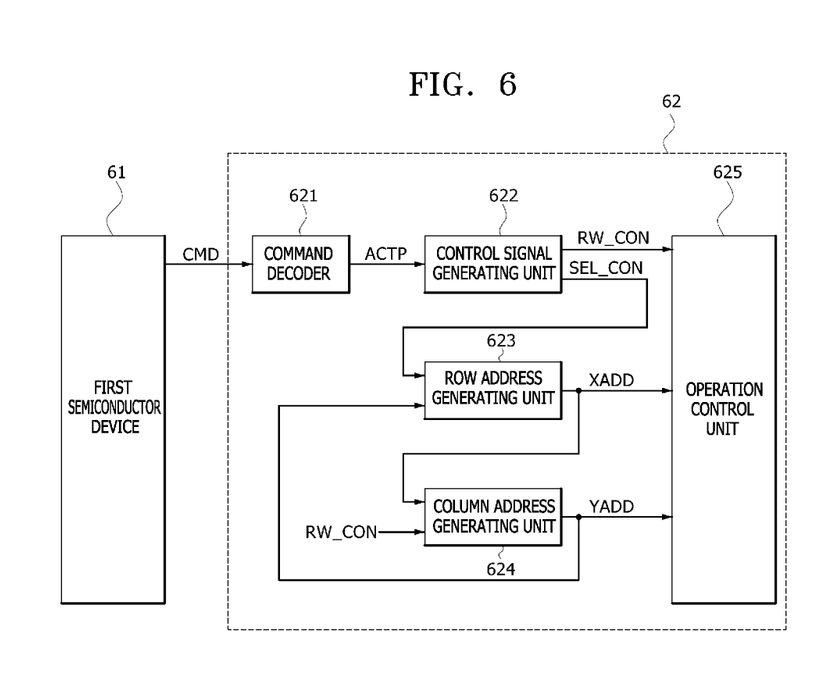
FIG. 6 is a block diagram illustrating a configuration of a semiconductor system according to an embodiment.

As described in FIG. 6, a semiconductor system according to an embodiment may include a first semiconductor device 61 and a second semiconductor device 62. The second semiconductor device 62 may include a command decoder 621, a control signal generating unit 622, a row address generating unit 623, a column address generating unit 624, and an operation control unit 625. The first semiconductor device 61 may provide a command CMD to the second semiconductor device 62. The first semiconductor device 61 may include a circuit that adjusts the timing of the command CMD (e.g., a point in time when the command CMD is applied to the second semiconductor device 62). According to various embodiments, various types of circuits may be used to adjust the timing of the command CMD.

The command decoder 621 may generate an active signal ACTP in response to the command CMD. The active signal ACTP may include pulse signals that are generated in synchronization with points in time when active operations start. The command CMD may include a signal that is encoded into a plurality of bits according to various embodiments. A logic-level combination of the command CMD generating the active signal ACTP may vary according to various embodiments.

The control signal generating unit 622 may generate a read/write control signal RW_CON and a selection control signal SEL_CON in response to the active signal ACTP. The control signal generating unit 622 may generate the selection control signal SEL_CON whose logic level changes whenever the pulse of the active signal ACTP is generated. In an embodiment, the control signal generating unit 622 may generate the read/write control signal RW_CON whose logic level changes in synchronization with a rising edge of the selection control signal SEL_CON. In another embodiment, the read/write control signal RW_CON may change its logic level in synchronization with a falling edge of the selection control signal SEL_CON. The selection control signal SEL_CON may have a combination of logic levels that indicates a certain address. The logic-level combination for selecting a specific address may vary according to various embodiments. The read/write control signal RW_CON may have a logic level that indicates a read operation and a write operation. In an embodiment, the read/write control signal RW_CON may be set to have a logic high level for a read operation and may be set to have a logic low level for a write operation. The logic levels of the read/write control signal RW_CON for executing the read operation and the write operation may vary according to various embodiments. In an embodiment, the control signal generating unit 622 may have substantially the same configuration as the circuit illustrated in FIG. 2.

The row address generating unit 623 may generate a row address signal XADD in response to the selection control signal SEL_CON and a column address signal YADD. The row address generating unit 623 may generate an $n^{th}$ row address (e.g., X(n) of FIG. 7) and an $(n+1)^{th}$ row address (e.g., X(n+1) of FIG. 7) in response to the column address signal YADD. The row address generating unit 623 may select and output, in response to the selection control signal SEL_CON, one of the $n^{th}$ row address (X(n) of FIG. 7) and the $(n+1)^{th}$ row address (X(n+1) of FIG. 7) as the row address signal XADD. Here, "n" may be a natural number. The row address signal XADD may be a signal that includes a plurality of bits according to an embodiment. The fact that the $n^{th}$ row address (e.g., X(n) of FIG. 7) is selected and outputted as the row address signal XADD means that the $n^{th}$ row address (e.g., X(n) of FIG. 7), which is selected among a plurality of row addresses included in the row address signal XADD, is enabled.

The column address generating unit 624 may generate the column address signal YADD in response to the read/write control signal RW_CON and the row address signal XADD. If the read/write control signal RW_CON having a predetermined logic level is inputted to column address generating unit 624 in a situation where a predetermined row address included in the column address signal YADD is enabled, the column address generating unit 624 may generate the column address signal YADD by using a counter circuit. For example, if a write operation of memory cells accessed by the $(n+1)^{th}$ row address (e.g., X(n+1) of FIG. 7) is performed while an $n^{th}$ column address (e.g., Y(n) of FIG. 9), which is selected among a plurality of column addresses included in the column address signal YADD, is activated, the column address signal YADD may be generated such that an $(n+1)^{th}$ column address (Y(n+1) of FIG. 9), which is selected among the plurality of column addresses included in the column address signal YADD, is activated.

The operation control unit 625 may perform read and write operations in response to the row address signal XADD, the column address signal YADD, and the read/write control signal RW_CON. For example, if the $n^{th}$ row address of the row address signal XADD and the $(n+1)^{th}$ column address of the column address signal YADD are activated in a situation where the read/write control signal RW_CON has a logic low level, a write operation of memory cells accessed by the $n^{th}$ row address and the $(n+1)^{th}$ column address may be performed.

Figure 7:
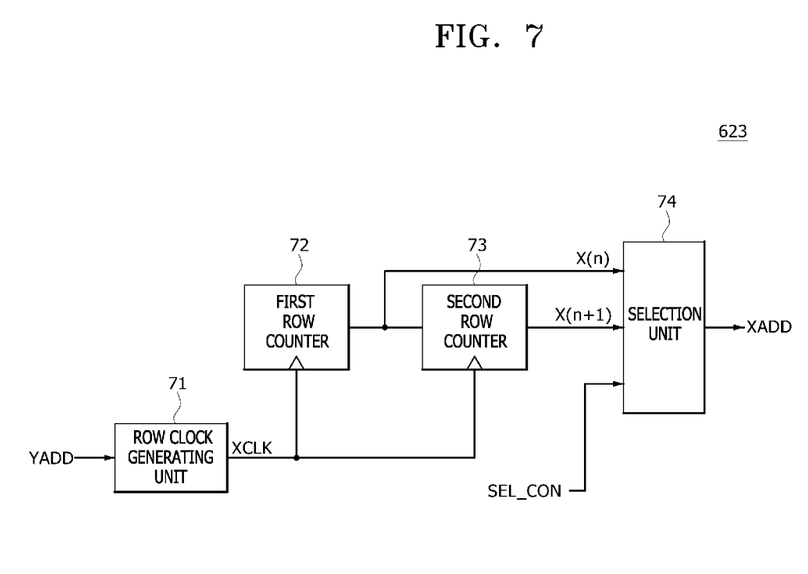
FIG. 7 is a block diagram illustrating a configuration of a row address generating unit included in the semiconductor system of FIG. 6.

Referring to FIG. 7, the row address generating unit 623 may include a row clock generating unit 71, a first row counter 72, a second row counter 73, and a selection unit 74.

The row clock generating unit 71 may generate a row clock XCLK in response to the column address signal YADD. If a predetermined column address among the column addresses included in the column address signal YADD is activated, the row clock generating unit 71 may generate a pulse of the row clock XCLK. For example, in a case where the column address signal YADD includes first to $K^{th}$ column addresses Y(1:K), if the first column address Y(1) or the K$^{th}$ column address Y(K) is activated, the row clock generating unit 71 may generate a pulse of the row clock XCLK.

The first row counter 72 may generate the n$^{th}$ row address X(n) included in the row address signal XADD in synchronization with the pulse of the row clock XCLK. The first row counter 72 may generate the n$^{th}$ row address X(n) by counting up every time the pulse of the row clock XCLK is inputted. For example, if the row address signal XADD includes first to M$^{th}$ row addresses X(1:M), the first row counter 72 may sequentially generate the first row address X(1) to the (M−1)th row address X(M−1) by counting up every time the pulse of the row clock XCLK is inputted.

The second row counter 73 may activate/generate the (n+1)$^{th}$ row address X(n+1) included in the row address signal XADD in synchronization with the pulse of the row clock XCLK. The second row counter 73 may generate the (n+1)$^{th}$ row address X(n+1) by counting up every time the pulse of the row clock XCLK is inputted. For example, if the row address signal XADD includes first to M$^{th}$ row addresses X(1:M), the second row counter 73 may sequentially generate the second row address X(2) to the M$^{th}$ row address X(M) by counting up every time the pulse of the row clock XCLK is inputted.

The selection unit 74 may select and output the n$^{th}$ row address X(n) or the (n+1)$^{th}$ row address X(n+1) as the row address signal XADD in response to the selection control signal SEL_CON. For example, the selection unit 74 may select the n$^{th}$ row address signal X(n) and output it as the row address signal XADD if the selection control signal SEL_CON has a logic high level, and the selection unit 74 may select the (n+1)$^{th}$ row address signal X(n+1) and output it as the row address signal XADD if the selection control signal SEL_CON has a logic low level. The logic level of the selection control signal SEL_CON for selecting the n$^{th}$ row address X(n) or the (n+1)$^{th}$ row address X(n+1) as the row address signal XADD may vary according to various embodiments. The fact that the n$^{th}$ row address X(n) is selected and outputted as the row address signal XADD means that the n$^{th}$ row address X(n), which is selected among the plurality of row addresses included in the row address signal YADD, is activated.

Figure 8:
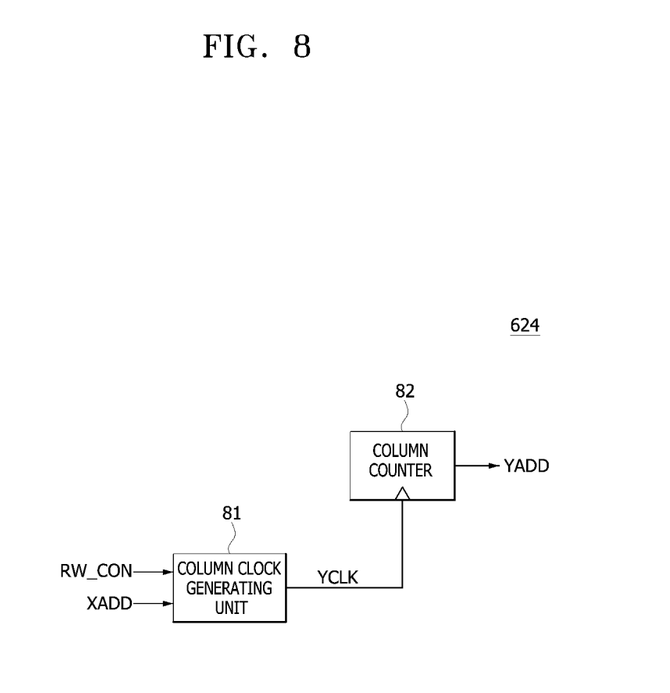
FIG. 8 is a block diagram illustrating a configuration of a column address generating unit included in the semiconductor system of FIG. 6.

Referring to FIG. 8, the column address generating unit 624 may include a column clock generating unit 81 and a column counter 82.

The column clock generating unit 81 may generate a column clock YCLK in response to the read/write control signal RW_CON and the row address signal XADD. If a write operation of memory cells corresponding to the (n+1)$^{th}$ row address X(n+1) is performed, the column clock generating unit 81 may generate a pulse of the column clock YCLK. For example, if the (n+1)$^{th}$ row address X(n+1) included in the row address signal XADD is activated while the read/write control signal RW_CON has a logic low level, the column clock generating unit 81 may generate the pulse of the column clock YCLK.

The column counter 82 may count a number of pulses of the column address signal YADD in synchronization with the pulse of the column clock YCLK. For example, if the column address signal YADD includes first to K$^{th}$ column addresses Y(1:K), the column counter 82 may sequentially generate the first column address Y(1) to the K$^{th}$ column address Y(K) by counting up every time the pulse of the column clock YCLK is inputted.

Figure 9:
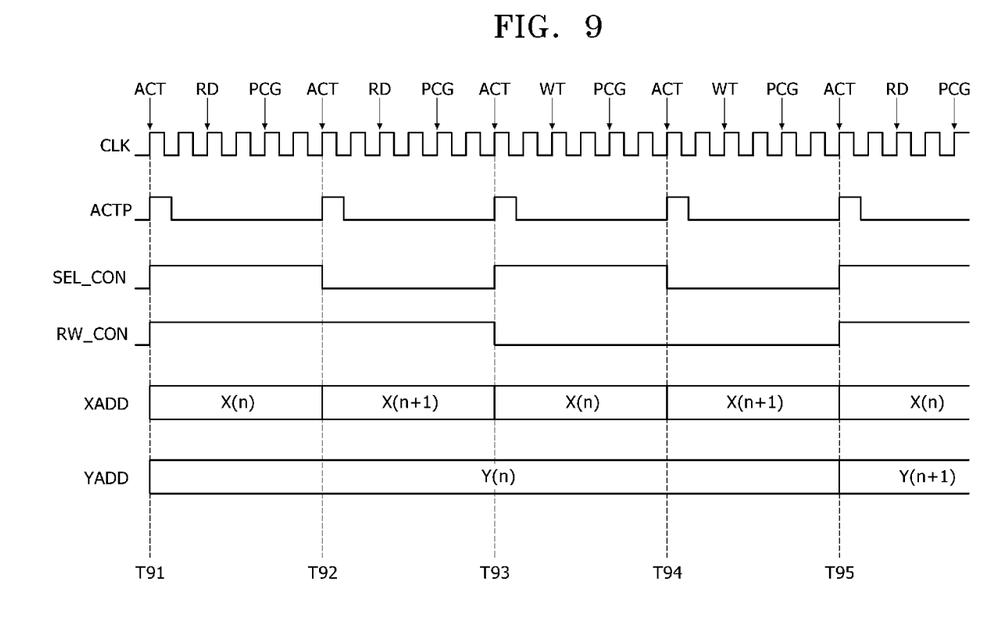
FIG. 9 is a timing diagram illustrating an operation of the semiconductor system of FIG. 6 to FIG. 8.

An operation of the semiconductor system having the configuration described with reference to FIG. 6 to FIG. 8 will be described hereinafter with reference to FIG. 9.

At a point in time T91, if an active command ACT included in the command CMD is inputted to the second semiconductor device 62, a first pulse of the active signal ACTP may be generated. At the point in time T91, a logic level of the selection control signal SEL_CON may change from a logic low level to a logic high level in response to the first pulse of the active signal ACTP to activate the n$^{th}$ row address X(n) included in the row address signal XADD. In addition, it is assumed that the n$^{th}$ column address Y(n) included in the column address signal YADD is activated. At the point in time T91, a level of the read/write control signal RW_CON may be changed from a logic low level into a logic high level in response to the selection control signal SEL_CON whose level is changed from a logic low level into a logic high level.

In a time period between the point in time T91 and a point in time T92, if a read command RD and a pre-charge command PCG are sequentially inputted through the command CMD, a read operation of memory cells accessed by the n$^{th}$ row address X(n) and the n$^{th}$ column address Y(n), which are activated, may be performed.

At the point in time T92, if the active command ACT included in the command CMD is inputted to the second semiconductor device 62, a second pulse of the active signal ACTP may be generated. At the point in time T92, a level of the selection control signal SEL_CON may be changed from a logic high level into a logic low level in response to the second pulse of the active signal ACTP to activate the (n+1)$^{th}$ row address X(n+1) included in the row address signal XADD.

In a time period between the point in time T92 and a point in time T93, if the read command RD and the pre-charge command PCG are sequentially inputted through the command CMD, the read operation of memory cells accessed by the (n+1)$^{th}$ row address X(n+1) and the n$^{th}$ column address Y(n), which are activated, may be performed.

At the point in time T93, if the active command ACT included in the command CMD is inputted to the second semiconductor device 62, a third pulse of the active signal ACTP may be generated. At the point in time T93, a logic level of the selection control signal SEL_CON may be changed from a logic low level into a logic high level in response to the third pulse of the active signal ACTP to activate the n$^{th}$ row address X(n) included in the row address signal XADD. In addition, a logic level of the read/write control signal RW_CON may be changed from a logic high level into a logic low level in response to the selection control signal SEL_CON whose level is changed from a logic low level to a logic high level.

In a time period between the point in time T93 and a point in time T94, if a write command WT and the pre-charge command PCG are sequentially inputted through the command CMD, a write operation of memory cells accessed by the n$^{th}$ row address X(n) and the n$^{th}$ column address Y(n), which are activated, may be performed.

At the point in time T94, if the active command ACT included in the command CMD is inputted to the second semiconductor device 62, a fourth pulse of the active signal ACTP may be generated. At the point in time T94, a logic level of the selection control signal SEL_CON may be changed from a logic high level into a logic low level in response to the fourth pulse of the active signal ACTP to activate the (n+1)$^{th}$ row address X(n+1) included in the row address signal XADD.

In a time period between the point in time T94 and a point in time T95, if the write command WT and the pre-charge command PCG are sequentially inputted through the command CMD, the write operation of memory cells accessed by the $(n+1)^{th}$ row address X(n+1) and the $n^{th}$ column address Y(n) which are activated may be performed.

At the point in time T95, if the active command ACT included in the command CMD is inputted to the second semiconductor device 62, a fifth pulse of the active signal ACTP may be generated. At the point in time T95, a logic level of the selection control signal SEL_CON may be changed from a logic low level into a logic high level in response to the fifth pulse of the active signal ACTP to activate the $n^{th}$ row address X(n) included in the row address signal YADD. In addition, a logic level of the read/write control signal RW_CON may be changed from a logic low level into a logic high level in response to the selection control signal SEL_CON whose level is changed from a logic low level to a logic high level.

At the point in time T95, since the write operation of the memory cells accessed by the $(n+1)^{th}$ row address X(n+1) and the $n^{th}$ column address Y(n) terminates, the $(n+1)^{th}$ column address Y(n+1) included in the column address signal YADD may be activated.

In a time period after the point in time T95, if the read command RD and the pre-charge command PCG are sequentially inputted through the command CMD, the read operation of memory cells accessed by the $n^{th}$ row address X(n) and the $(n+1)^{th}$ column address Y(n+1) which are activated may be performed.

As described above, in some embodiment, the semiconductor device may automatically generate the row address signal XADD and the column address signal YADD by counting up in synchronization with the pulses of the active signal ACTP, which are sequentially generated, and may sequentially perform the read operation and the write operation of the memory cells accessed by the counted row address signal XADD and the counted column address signal YADD while the row address signal XADD and the column address signal YADD are automatically generated. Thus, the total test time may be reduced.

According to various embodiments, a row address and a column address may be automatically generated by counting up in response to an active signal, and a read operation and a write operation are automatically controlled in response to the active signal. Thus, it is possible to achieve faster test times.

What is claimed is:

1. A semiconductor device comprising:
    a control signal generating unit suitable for generating a read/write control signal and a selection control signal in response to an active signal;
    a first address generating unit suitable for generating a first address signal in response to the selection control signal and a second address signal; and
    a second address generating unit suitable for generating the second address signal in response to the read/write control signal and the first address signal.

2. The device of claim 1, wherein:
    the control signal generating unit generates the selection control signal by dividing the frequency of the active signal; and
    the control signal generating unit generates the read/write control signal by dividing the frequency of the selection control signal.

3. The device of claim 1, wherein:
    the control signal generating unit changes a logic level of the selection control signal in synchronization with a pulse of the active signal; and
    the control signal generating unit changes a logic level of the read/write control signal in synchronization with a predetermined edge of the selection control signal.

4. The device of claim 1, wherein:
    the first address generating unit generates a first address and a second address activated in synchronization with a clock generated from a clock generating unit in response to the second address signal; and
    the first address generating unit selects and outputs one of the first address and the second address as the first address signal in response to the selection control signal.

5. The device of claim 4, wherein the first address generating unit includes the clock generating unit suitable for generating a pulse of the clock if a predetermined address among a plurality of addresses included in the second address signal is activated.

6. The device of claim 4, wherein the first address generating unit includes:
    a first counter suitable for generating the first address by counting up every time the pulse of the clock is inputted thereto; and
    a second counter suitable for generating the second address by counting up every time the pulse of the clock is inputted thereto.

7. The device of claim 1, wherein the second address generating unit generates the second address signal in synchronization with a clock generated from a clock generating unit in response to the read/write control signal and the first address.

8. The device of claim 7, wherein the second address generating unit includes the clock generating unit suitable for generating a pulse of the clock if a predetermined operation of a predetermined memory cell terminates in response to the read/write control signal and the first address signal.

9. The device of claim 1, further comprising an operation control unit suitable for performing, in response to the read/write control signal, a predetermined operation on a memory cell accessed by the first address signal and the second address signal.

10. The device of claim 1, wherein the first address signal is a row address signal and the second address signal is a column address signal.

11. The device of claim 1, wherein the first address signal is a column address signal and the second address signal is a row address signal.

12. A semiconductor system comprising:
    a first semiconductor device suitable for outputting a command; and
    a second semiconductor device suitable for generating a read/write control signal and a selection control signal in response to an active signal generated by decoding the command, suitable for generating a first address signal in response to the selection control signal and a second address signal, and suitable for generating the second address signal in response to the read/write control signal and the first address signal.

13. The system of claim 12, wherein the second semiconductor device generates the selection control signal by dividing the frequency of the active signal and generates the read/write control signal by dividing the frequency of the selection control signal.

14. The system of claim 12, wherein the second semiconductor device changes a logic level of the selection control signal in synchronization with a pulse of the active signal and changes a logic level of the read/write control signal in synchronization with a predetermined edge of the selection control signal.

15. The system of claim 14, wherein a pulse of a first clock is generated if a predetermined address among a plurality of addresses included in the second address signal is activated.

16. The system of claim 12, wherein the second semiconductor device generates the second address signal in synchronization with a second clock generated from a clock generating unit in response to the read/write control signal and the first address signal.

17. The system of claim 16, wherein a pulse of the second clock is generated if a predetermined operation of a predetermined memory cell terminates in response to the read/write control signal and the first address signal.

18. The system of claim 12, wherein the second semiconductor device performs, in response to the read/write control signal, a predetermined operation on a memory cell accessed by the first address signal and the second address signal.

19. The system of claim 12, wherein the first address signal is a row address signal and the second address signal is a column address signal.

20. The system of claim 12, wherein the first address signal is a column address signal and the second address signal is a row address signal.

* * * * *